(12) United States Patent
Shelestak et al.

(10) Patent No.: US 11,352,287 B2
(45) Date of Patent: Jun. 7, 2022

(54) HIGH STRAIN POINT GLASS

(71) Applicant: Vitro S.A.B. de C.V., Nuevo León (MX)

(72) Inventors: Larry J. Shelestak, Bairdford, PA (US); James W. McCamy, Export, PA (US); Paul R. Ohodnicki, Jr., Allison Park, PA (US); Hong Li, Sewickley, PA (US); Adam D. Polcyn, Pittsburgh, PA (US)

(73) Assignee: Vitro Flat Glass LLC, Cheswick, PA (US)

( * ) Notice: Subject to any disclaimer, the term of this patent is extended or adjusted under 35 U.S.C. 154(b) by 373 days.

(21) Appl. No.: 13/687,091

(22) Filed: Nov. 28, 2012

(65) Prior Publication Data

US 2014/0144498 A1    May 29, 2014

(51) Int. Cl.
*C03C 3/087* (2006.01)
*G11B 5/73* (2006.01)
*H01L 31/0392* (2006.01)

(52) U.S. Cl.
CPC .......... *C03C 3/087* (2013.01); *G11B 5/73921* (2019.05); *H01L 31/0392* (2013.01); *H01L 31/03925* (2013.01); *Y02E 10/50* (2013.01)

(58) Field of Classification Search
CPC ... C03C 3/078; C03C 3/087; H01L 31/03925; G11B 5/7325
USPC .................................. 136/243–265; 501/70
See application file for complete search history.

(56) References Cited

U.S. PATENT DOCUMENTS

| | | | |
|---|---|---|---|
| 3,524,738 A | 8/1970 | Grubb et al. | |
| 3,900,329 A | 8/1975 | Grubb et al. | |
| 4,015,045 A | * 3/1977 | Rinehart | C03C 3/083 |
| | | | 428/410 |
| 4,675,224 A | * 6/1987 | Hosokawa | 428/828 |
| 5,029,317 A | 7/1991 | Kawai et al. | |

(Continued)

FOREIGN PATENT DOCUMENTS

EP    0 090 094 A1    10/1983
EP    1 893 541 A2    3/2008

(Continued)

OTHER PUBLICATIONS

US 7,371,155 B2, 05/2008, Minami et al. (withdrawn)
PCT Search Report, PCT/US2013/069835 dated Feb. 26, 2014.

*Primary Examiner* — Niki Bakhtiari
(74) *Attorney, Agent, or Firm* — The Webb Law Firm

(57) ABSTRACT

The present invention relates to a glass composition that includes: 57 to 75 percent by weight of $SiO_2$; 3 to 11 percent by weight of $Al_2O_3$; 6 to 11 percent by weight of $Na_2O$; 16 to 21 percent by weight of CaO; 0.01 to 0.1 percent by weight of $Li_2O$; and less than 0.05 percent by weight of $K_2O$. Each percent by weight is based on total weight of the glass composition. Glass products are also provided that have a bulk glass composition as described above. The glass products, such as flat glass products and glass substrates, have a strain point of at least 590° C. and a thermal expansion of at least 7.4 ppm/° C. The present invention also relates to magnetic recording articles and photovoltaic cells that include a glass substrate that has a bulk glass composition as described above.

21 Claims, 2 Drawing Sheets

(56) References Cited

U.S. PATENT DOCUMENTS

| | | |
|---|---|---|
| 5,261,968 A * | 11/1993 | Jordan ............ H01L 31/022466 136/244 |
| 5,599,754 A | 2/1997 | Maeda et al. |
| 5,654,057 A | 8/1997 | Kitayama et al. |
| 5,681,609 A | 10/1997 | Kitayama et al. |
| 5,691,256 A | 11/1997 | Taguchi et al. |
| 5,725,625 A | 3/1998 | Kitayama et al. |
| 5,780,371 A | 7/1998 | Rifqi et al. |
| 5,846,280 A | 12/1998 | Speit |
| 5,874,376 A | 2/1999 | Taguchi et al. |
| 5,895,768 A | 4/1999 | Speit |
| 5,900,296 A | 5/1999 | Hayashi et al. |
| 5,902,665 A | 5/1999 | Kuroda |
| 5,972,460 A | 10/1999 | Tachiwana |
| 5,997,977 A | 12/1999 | Zou et al. |
| 6,040,029 A | 3/2000 | Yamamoto et al. |
| 6,048,466 A | 4/2000 | Morizane et al. |
| 6,087,284 A | 7/2000 | Brix et al. |
| 6,114,039 A | 9/2000 | Rifqi |
| 6,119,483 A | 9/2000 | Takahashi et al. |
| 6,132,843 A | 10/2000 | Kuroda et al. |
| 6,134,918 A | 10/2000 | Eto et al. |
| 6,136,401 A | 10/2000 | Yamamoto et al. |
| 6,184,162 B1 | 2/2001 | Speit et al. |
| 6,187,407 B1 | 2/2001 | Zou et al. |
| 6,187,441 B1 | 2/2001 | Takeuchi et al. |
| 6,251,812 B1 | 6/2001 | Koyama et al. |
| 6,303,528 B1 | 10/2001 | Speit et al. |
| 6,306,786 B1 | 10/2001 | Koyama et al. |
| 6,332,338 B1 | 12/2001 | Hashimoto et al. |
| 6,340,647 B1 | 1/2002 | Koyama et al. |
| 6,365,534 B1 | 4/2002 | Koyama et al. |
| 6,376,402 B1 | 4/2002 | Pannhorst et al. |
| 6,376,403 B1 | 4/2002 | Koyama et al. |
| 6,383,404 B1 | 5/2002 | Sakai et al. |
| 6,399,527 B1 | 6/2002 | Kishimoto et al. |
| 6,413,892 B1 | 7/2002 | Koyama et al. |
| 6,436,859 B1 | 8/2002 | Muramoto et al. |
| 6,440,531 B1 | 8/2002 | Kurachi et al. |
| 6,451,720 B1 | 9/2002 | Kishimoto et al. |
| 6,475,599 B1 | 11/2002 | Saito et al. |
| 6,553,788 B1 | 4/2003 | Ikeda et al. |
| 6,577,472 B2 | 6/2003 | Yamamoto et al. |
| 6,707,526 B2 | 3/2004 | Peuchert et al. |
| 6,713,418 B2 | 3/2004 | Kishimoto et al. |
| 6,782,717 B2 | 8/2004 | Saito et al. |
| 6,819,526 B2 | 11/2004 | Kataoka et al. |
| 7,044,839 B2 | 5/2006 | Maeda |
| 7,065,984 B2 | 6/2006 | Kezuka et al. |
| 7,090,937 B2 | 8/2006 | Ikenishi et al. |
| 7,140,203 B2 | 11/2006 | Saito et al. |
| 7,192,898 B2 | 3/2007 | Mori et al. |
| 7,273,668 B2 | 9/2007 | Kurachi et al. |
| 7,281,394 B2 | 10/2007 | Ikeda et al. |
| 7,298,588 B2 | 11/2007 | Lee et al. |
| 7,309,671 B2 | 12/2007 | Kurachi et al. |
| 7,314,575 B2 | 1/2008 | Marumo et al. |
| 7,323,259 B2 | 1/2008 | Chen et al. |
| 7,323,426 B2 | 1/2008 | Aitken |
| 7,429,209 B2 | 9/2008 | Horisaka et al. |
| 7,438,630 B2 | 10/2008 | Miyamoto |
| 7,670,976 B2 | 3/2010 | Lee et al. |
| RE41,217 E | 4/2010 | Ganesan et al. |
| 7,727,916 B2 | 6/2010 | Peuchert et al. |
| 8,287,958 B2 | 10/2012 | Lyon et al. |
| 8,394,516 B2 | 3/2013 | Matsumoto et al. |
| 2009/0123870 A1 * | 5/2009 | Usa ........ B82Y 10/00 430/296 |
| 2010/0012188 A1 * | 1/2010 | Garnett ........ 136/260 |
| 2010/0084016 A1 | 4/2010 | Aitken et al. |
| 2010/0213443 A1 | 8/2010 | Sapochak et al. |
| 2010/0288351 A1 | 11/2010 | Speit et al. |
| 2010/0300535 A1 | 12/2010 | Aitken et al. |
| 2010/0300536 A1 | 12/2010 | Aitken et al. |
| 2011/0017287 A1 * | 1/2011 | Borrelli ............ H01L 31/02168 136/256 |
| 2011/0017297 A1 | 1/2011 | Aitken et al. |
| 2011/0094584 A1 | 4/2011 | Sawada et al. |
| 2011/0135938 A1 * | 6/2011 | Kim ........ C03B 5/235 428/426 |
| 2011/0265863 A1 | 11/2011 | Nagashima et al. |
| 2011/0303259 A1 | 12/2011 | Fechner et al. |
| 2012/0037229 A1 | 2/2012 | Dawson-Elli et al. |
| 2012/0052275 A1 * | 3/2012 | Hashimoto ............ C03C 3/087 428/215 |
| 2012/0053044 A1 | 3/2012 | Lee et al. |
| 2012/0060434 A1 | 3/2012 | Jacobs |
| 2012/0141804 A1 | 6/2012 | Miyabe et al. |

FOREIGN PATENT DOCUMENTS

| | | |
|---|---|---|
| EP | 2 233 445 A1 | 9/2010 |
| EP | 2 299 536 A1 | 3/2011 |
| EP | 2 311 099 A1 | 4/2011 |
| EP | 2 325 147 A1 | 5/2011 |
| EP | 2 346 085 A1 | 7/2011 |
| EP | 2 349 938 A2 | 8/2011 |
| GB | 1 254 260 | 11/1971 |
| JP | 2010267965 A | 11/2010 |
| WO | 2009028561 A1 | 3/2009 |
| WO | 2010002477 A1 | 1/2010 |
| WO | 2011/011667 A1 | 1/2011 |
| WO | 2011/018883 A1 | 2/2011 |
| WO | 2011/035889 A1 | 3/2011 |
| WO | 2011/146895 A2 | 11/2011 |
| WO | 2012057338 A1 | 5/2012 |

* cited by examiner

HIGH STRAIN POINT GLASS

FIELD OF THE INVENTION

The present invention relates to glass compositions and glass products prepared therefrom, which can have a combination of high strain point, such as at least 590° C., and, with some embodiments, a coefficient of thermal expansion of at least 7.4 ppm/° C.

BACKGROUND OF THE INVENTION

Glass substrates are used in a number of applications, such as substrates for magnetic recording articles and photovoltaic cells. An example of magnetic recording articles which include a glass substrate are hard disc drives used in computer related applications. The glass substrate of a hard disc drive typically has one or more magnetic materials applied thereto and/or thereover. The magnetic materials are typically applied to the glass substrate at an elevated temperature. With certain hard disc drive technologies, the magnetic materials are applied so as to form a perpendicular recording medium, in which the magnetic materials stand upright on the glass substrate. The formation of perpendicular recording media typically requires higher application temperatures compared to the temperatures typically required with the formation of longitudinal recording media. The higher temperatures associated with the formation of perpendicular recording media typically require a glass substrate having a strain point of at least 590° C.

With photovoltaic cells and modules, one or more layers of semiconductor materials are applied onto and/or over a substrate, such as a glass substrate. Application of each semiconductor layer is typically conducted at elevated temperatures. In the case of thin film photovoltaic cells and modules, even higher temperatures are typically required when forming each semiconductor layer, which can include cadmium (Cd) and/or telluride (Te) semiconductor materials and alloys thereof. The higher temperatures associated with forming a thin film photovoltaic cell or module, for example, that includes at least one CdTe layer, typically require a glass substrate having a strain point of at least 590° C.

With some applications, the glass substrate having a high strain point is part of an assembly that includes one or more other glass components having a lower strain point that provides, for example, a mounting surface for the assembly. Photovoltaic modules, for example, can include a glass backing plate. For economic reasons, such as reducing costs, the glass backing plate is formed from a lower cost material, such as soda-lime glass, which has a lower strain point. With such assemblies, it can be desirable that the coefficient of thermal expansion values of the low and high strain point glass components thereof have a minimum variance (or difference) therebetween. A minimum variance (or difference) in the coefficient of thermal expansion values can reduce or minimize the likelihood of delamination therebetween and/or reduced structural integrity of the assembly after exposure to repeated temperature fluctuations.

Glass compositions that include rare earth oxides, such as lanthanide oxide and/or yttrium oxide, can provide glass products having increased strain points. Glass compositions that include boron, such as boron trioxide, can also provide glass products having increased strain points. Such glass compositions can, however, provide glass products having increased costs associated therewith. In addition, such glass compositions can provide glass products having coefficient of thermal expansion values that are not sufficiently close enough (or matched) to the coefficient of thermal expansion values of lower cost and low strain point glass components, thus, undesirably precluding assembly with such lower cost and low strain point glass components.

It would be desirable to develop alternative glass compositions that provide glass products having increased strain points. In addition, it would be desirable that such newly developed alternative glass compositions also provide, at least in some applications, glass products having coefficient of thermal expansion values that are sufficiently close enough (or matched) to those of low strain point glass products, such as soda-lime glass.

SUMMARY OF THE INVENTION

In accordance with the present invention, there is provided a glass composition that comprises, consists essentially of, or consists of: 57 to 75 percent by weight of $SiO_2$; 3 to 11 percent by weight of $Al_2O_3$; 6 to 11 percent by weight of $Na_2O$; 16 to 21 percent by weight of CaO; 0.01 to 0.1 percent by weight of $Li_2O$; and less than 0.05 percent by weight of $K_2O$, in which each percent by weight is based on total weight of said glass composition.

In accordance with the present invention, there is further provided a glass product prepared from the above glass composition, in which the glass product has a strain point of at least 590° C. and, optionally, a coefficient of thermal expansion of at least 7.4 ppm/° C.

In accordance with the present invention, there is also provided a glass product having a bulk glass composition comprising, consisting essentially of, or consisting of: 57 to 75 percent by weight of $SiO_2$; 3 to 11 percent by weight of $Al_2O_3$; 6 to 11 percent by weight of $Na_2O$; 16 to 21 percent by weight of CaO; 0.01 to 0.1 percent by weight of $Li_2O$; and less than 0.05 percent by weight of $K_2O$, in which each percent by weight is based on total weight of the bulk glass composition.

In accordance with the present invention, there is additionally provided a magnetic recording article that comprises a glass substrate, in which the glass substrate has a bulk glass composition comprising, consisting essentially of, or consisting of: 57 to 75 percent by weight of $SiO_2$; 3 to 11 percent by weight of $Al_2O_3$; 6 to 11 percent by weight of $Na_2O$; 16 to 21 percent by weight of CaO; 0.01 to 0.1 percent by weight of $Li_2O$; and less than 0.05 percent by weight of $K_2O$, in which each percent by weight is based on total weight of said bulk glass composition.

In accordance with the present invention, there is further additionally provided a photovoltaic cell comprising a glass substrate and at least one semiconductor layer over the glass substrate, in which the glass substrate has a bulk glass composition comprising, consisting essentially of, or consisting of: 57 to 75 percent by weight of $SiO_2$; 3 to 11 percent by weight of $Al_2O_3$; 6 to 11 percent by weight of $Na_2O$; 16 to 21 percent by weight of CaO; 0.01 to 0.1 percent by weight of $Li_2O$; and less than 0.05 percent by weight of $K_2O$, in which each percent by weight is based on total weight of the bulk glass composition.

BRIEF DESCRIPTION OF THE DRAWINGS

In FIGS. 1 and 2, which are not to scale, like reference characters designate the same components and structural features.

DETAILED DESCRIPTION OF THE INVENTION

Figure 1:
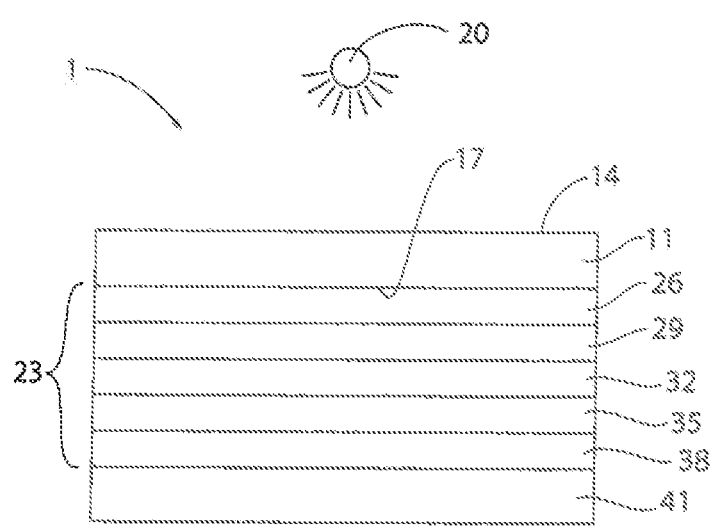
FIG. 1 is a representative sectional view of a photovoltaic cell according to the present invention.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting.

Other than in the operating examples, or where otherwise indicated, all numbers expressing quantities of ingredients, reaction conditions, processing parameters, physical characteristics, dimensions, and the like used in the specification and claims are to be understood as modified in all instances by the term "about." Accordingly, unless indicated to the contrary, the numerical values set forth in the following specification and claims can vary depending upon the desired properties sought to be obtained by the present invention.

Additionally, at the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like.

As used herein, the terms "formed over," "deposited over," "residing over," or "provided over" mean formed, deposited, or provided on but not necessarily in direct (or abutting) contact with the surface. For example, a coating layer "formed over" or "residing over" a substrate does not preclude the presence of one or more other coating layers or films of the same or different composition located between the formed (or identified) coating layer and the substrate.

The term "visible region" and related terms, such as "visible light" as used herein means electromagnetic radiation having a wavelength in the range of 380 nm to 780 nm.

The term "infrared region" and related terms, such as "infrared radiation" as used herein mean electromagnetic radiation having a wavelength in the range of greater than 780 nm to 100,000 nm.

The term "ultraviolet region" and related terms, such as "ultraviolet radiation" mean electromagnetic energy having a wavelength in the range of 100 nm to less than 380 nm.

All documents, such as but not limited to issued patents and patent applications, referred to herein are to be considered to be "incorporated by reference" in their entirety.

As used herein, the articles "a," "an," and "the" include plural referents unless otherwise expressly and unequivocally limited to one referent.

As used herein, the term "transparent" means having a transmission of greater than 0% up to 100% in a desired wavelength range, such as visible light. As used herein, the term "translucent" means allowing electromagnetic radiation, such as visible light, to be transmitted but diffusing or scattering this electromagnetic radiation. As used herein, the term "opaque" means having a transmission of substantially 0%, such as 0%, in a desired wavelength range, such as visible light.

As used herein, the term "bulk glass composition" means that portion of a glass product that resides within (or between) the surfaces thereof, and does not include the composition of one or more treatments and/or layers that may reside on one or more surfaces of the glass product.

The "bulk glass composition" of a glass product can be determined with some embodiments based on the components of the glass composition from which the glass product is prepared.

The "bulk glass composition" of a glass product can be determined with some further embodiments by analytical methods, such as by art-recognized X-ray fluorescence methods.

As used herein, "strain point" temperature values means the temperature at which the glass product has a viscosity of LOG 14.5 in units of poise, and is determined in accordance with a fiber elongation method based on American Society for Testing and Materials (ASTM) C336-71.

As used herein, "coefficient of thermal expansion" values (or CTE values) are determined using an Orton dilatometer in accordance with ASTM E228-06 over a temperature range of 25° C. to 300° C.

Unless otherwise indicated, percent by weight values of the various components of the glass compositions of the present invention are in each case based on total weight of the glass compositions.

Unless otherwise indicated, percent by weight values of the various components of the bulk glass compositions of the glass articles and products of the present invention are in each case based on total weight of the bulk glass composition.

In accordance with some embodiments, $Al_2O_3$ is present in the glass compositions, and bulk glass compositions of the glass products and articles, of the present invention, in an amount of 4 to 10 percent by weight, inclusive of the recited values. The amount of aluminum oxide ($Al_2O_3$) is selected, with some embodiments, so as to provide a glass product (or glass article) having a desirable strain point, such as a strain point of at least 590° C.

With some embodiments, $Al_2O_3$ is present in the glass compositions, and bulk glass compositions of the glass products and articles, of the present invention, in an amount of 4.5 to 9.5 percent by weight, inclusive of the recited values, and based on total weight of the composition.

With some embodiments, $Na_2O$ is present in the glass compositions, and bulk glass compositions of the glass products and articles, of the present invention, in an amount of 7 to 10 percent by weight, inclusive of the recited values, and based on total weight of the composition. The amount of sodium oxide ($Na_2O$) is selected, with some embodiments, so as to provide a glass product (or glass article) having a desirable coefficient of thermal expansion, such as at least 7.4 ppm/° C.

In accordance with some further embodiments, $Na_2O$ is present in the glass compositions, and bulk glass compositions of the glass products and articles, of the present invention, in an amount of 7.5 to 9.5 percent by weight, inclusive of the recited values.

With some additional embodiments, CaO is present in the glass compositions, and bulk glass compositions of the glass products and articles, of the present invention, in an amount of 17 to 20 percent by weight, inclusive of the recited values, and based on total weight of the composition. The amount of calcium oxide (CaO) is selected, with some embodiments, so as to aid in dissolution of the silica ($SiO_2$), and, as such, can be described as a flux or flux agent with some embodiments. With some additional embodiments, the amount of CaO is selected so as to provide the glass composition with a reduced melting point, and resulting glass products and articles with an elevated strain point.

Calcium oxide (CaO) is present in the glass compositions, and bulk glass compositions of the glass products and articles, of the present invention, with some embodiments, in an amount of from 17 to 19 percent by weight, inclusive of the recited values, and based on total weight of the composition.

The glass compositions, and bulk glass compositions of the glass products and articles, of the present invention, with some embodiments include: 4 to 10 percent by weight of $Al_2O_3$; 7 to 10 percent by weight of $Na_2O$; and 17 to 20 percent by weight of CaO, in each case inclusive of the recited values, and based on total weight of the composition.

In accordance with some additional embodiments, the glass compositions, and bulk glass compositions of the glass products and articles, of the present invention include: 4.5 to 9.5 percent by weight of $Al_2O_3$; 7.5 to 9.5 percent by weight of $Na_2O$; and 17 to 19 percent by weight of CaO, in each case inclusive of the recited values, and based on total weight of the composition.

The weight ratio of $Al_2O_3$ to $Na_2O$ of the glass compositions, and bulk glass compositions of the glass products and articles, of the present invention, can, with some embodiments, range from 0.5 to 1, or from 0.5 to 1.0, or from 0.57 to 1.0, or from 0.6 to 1, or from 0.6 to 1.0, inclusive in each case of the recited values.

The weight ratio of $Al_2O_3$ to CaO of the glass compositions, and bulk glass compositions of the glass products and articles, of the present invention, can, with some embodiments, range from 0.2 to 0.5, or from 0.23 to 0.5, or from 0.25 to 0.5, or from 0.26 to 0.5, inclusive in each case of the recited values.

The weight ratio of $Na_2O$ to CaO of the glass compositions, and bulk glass compositions of the glass products and articles, of the present invention, can, with some embodiments, range from 0.4 to 0.6, or from 0.4 to 0.5, or from 0.41 to 0.5, or from 0.44 to 0.5, or from 0.45 to 0.5, inclusive in each case of the recited values.

In accordance with some embodiments, the glass compositions, and bulk glass compositions of the glass products and articles, of the present invention, include a combination of weight ratios of various components thereof as follows: a weight ratio of $Al_2O_3$ to $Na_2O$ of from 0.5 to 1.0; a weight ratio of $Al_2O_3$ to CaO of from 0.2 to 0.5; and a weight ratio of $Na_2O$ to CaO of from 0.4 to 0.5, in each case inclusive of the recited values.

In accordance with some further embodiments, the glass compositions, and bulk glass compositions of the glass products and articles, of the present invention, include a combination of weight ratios of various components thereof as follows: a weight ratio of $Al_2O_3$ to $Na_2O$ of from 0.6 to 1.0; a weight ratio of $Al_2O_3$ to CaO of from 0.26 to 0.5; and a weight ratio of $Na_2O$ to CaO of from 0.44 to 0.5, in each case inclusive of the recited values.

As discussed previously above, the glass compositions, and bulk glass compositions of the glass products and articles, of the present invention, include $Li_2O$ in an amount of from 0.01 to 0.1 percent by weight, inclusive of the recited values, and based on total weight of the composition. With some embodiments, $Li_2O$ is present in the glass compositions, and bulk glass compositions of the glass products and articles, of the present invention, in an amount of from 0.02 to 0.08 percent by weight, inclusive of the recited values, and based on total weight of the composition. With some embodiments, $Li_2O$ is added as a flux or flux agent, for purposes of lowering the melting point of the glass composition.

The glass compositions, and bulk glass compositions of the glass products and articles, of the present invention, as discussed previously above, include less than 0.05 percent by weight of $K_2O$. While the amount of $K_2O$ can be 0 percent by weight, with some embodiments, some $K_2O$ is typically present, such as at least 0.0005 percent by weight, or at least 0.001 percent by weight. The amount of $K_2O$, with some embodiments, ranges from 0.0005 to less than 0.05 percent by weight, or from 0.001 to less than 0.05 percent by weight, such as from 0.0005 to 0.04 percent by weight, or from 0.001 to 0.04 percent by weight. With some embodiments, $K_2O$ is present in the $SiO_2$ component of the glass compositions, and bulk glass compositions of the glass products and articles, of the present invention. In accordance with some further embodiments, if present, the $K_2O$ is present in the $SiO_2$ component of the glass compositions, and $K_2O$ is not added separately to the glass compositions of the present invention.

With some embodiments, the glass compositions of the present invention include refining agents, such as alkali metal sulfates, such as sodium sulfate. Refining agents if present in the glass composition, are not present in the resulting glass products or articles, with some embodiments, because they often form gases, such as $SO_3$, which migrate out of the glass melt. With some embodiments, the glass compositions of the present invention include sodium sulfate in an amount of from 0.2 to 0.4 percent by weight, inclusive of the recited values, and based on total weight of the glass composition. The glass compositions, and bulk glass compositions of the glass products and articles, of the present invention include, with some embodiments, residual refining agents in amounts that do not affect, alter, or otherwise contribute to the physical properties of the glass compositions, and bulk glass compositions of the glass products or articles, such as in amounts of less than or equal to 0.02 percent by weight, or less than or equal to 0.01 percent by weight, or less than or equal to 0.005 percent by weight, based on total weight of the composition.

In accordance with some embodiments, the glass compositions, and bulk glass compositions of the glass products and articles, of the present invention, include impurities (sometimes referred to as tramp materials) in amounts of less than or equal to 0.02 percent by weight, or less than or equal to 0.01 percent by weight, or less than or equal to 0.005 percent by weight, based on total weight of the composition. If present, the impurities do not affect, alter, or otherwise contribute to the physical properties of the glass compositions, and bulk glass compositions of the glass products or articles of the present invention. Examples of impurities that can be present in the glass compositions, and bulk glass compositions of the glass products and articles, of the present invention, include, but are not limited to MgO, and iron oxide (such as FeO), in impurity amounts of less than or equal to 0.02 percent by weight, or less than or equal to 0.01 percent by weight, or less than or equal to 0.005 percent by weight, based on total weight of the composition.

The glass compositions, and bulk glass compositions of the glass products and articles, of the present invention, with some embodiments, are free of certain materials. With some embodiments, the term "free of" means less than 0.02 percent by weight, or less than 0.01 percent by weight, or less than 0.005 percent by weight. With some additional embodiments, the term "free of" means 0 percent by weight, or not present in any measurable amount. The glass compositions, and bulk glass compositions of the glass products and articles, of the present invention, with some embodiments, are free of materials, such as, but not limited to, tin oxide, barium oxide, zirconium oxide, strontium oxide, magnesium oxide, iron oxide, and rare earth oxides (also referred to as rare earth metal oxides). Rare earth oxides, that the glass compositions, and bulk glass compositions of the glass products and articles, of the present invention, are free of, can be represented by the formula $RE_2O_3$, in which RE means rare earth (or rare earth metal), such as Sc, Y, La, Ce, Pr, Nd, Sm, Eu, Gd, Tb, Dy, Ho, Er, Tm, Yb, Ln, and combinations thereof.

Glass products and articles, such as, but not limited to, flat glass products and glass substrates, in accordance with some embodiments of the present invention, have a strain point of at least 590° C., or at least 600° C., or at least 625° C., or at least 650° C. With some embodiments, glass products and articles of the present invention, such as, but not limited to, flat glass products and glass substrates, have a strain point of less than or equal to 800° C., or less than or equal to 750° C., or less than or equal to 725° C., or less than or equal to 700° C. The strain point of the glass products and articles of the present invention can, with some embodiments, range between any combination of these lower and upper values, such as from 590° C. to 800° C., or from 590° C. to 750° C., or from 600° C. to 725° C., or from 625° C. to 700° C., or from 650° C. to 680° C., in each case inclusive of the recited values.

Glass products and articles, such as, but not limited to, flat glass products and glass substrates, in accordance with some embodiments of the present invention, have a coefficient of thermal expansion of at least 7.4 ppm/° C., or at least 7.5 ppm/° C., or at least 7.8 ppm/° C., or at least 8.0 ppm/° C., or at least 8.25 ppm/° C. With some embodiments, glass products and articles of the present invention, such as, but not limited to, flat glass products and glass substrates, have a coefficient of thermal expansion of less than or equal to 9.0 ppm/° C., or less than or equal to 8.8 ppm/° C., or less than or equal to 8.6 ppm/° C., or less than or equal to 8.5 ppm/° C. The coefficient of thermal expansion of the glass products and articles of the present invention can, with some embodiments, range between any combination of these lower and upper values, such as from 7.4 to 9.0 ppm/° C., or from 7.5 to 8.8 ppm/° C., or from 7.8 to 8.6 ppm/° C., or from 8.25 to 8.5 ppm/° C., in each case inclusive of the recited values.

The glass products formed from the glass compositions of the present invention are, with some embodiments, in the form of a flat glass product.

In accordance with some embodiments, glass products formed from the glass compositions of the present invention are in the form of a substrate (or glass substrate). Glass substrates, with some embodiments of the present invention, can have any suitable thickness, such as up to 24 mm, or from 2 mm to 24 mm, or from 4 mm to 24 mm, or from 5 mm to 24 mm.

The glass products or articles, such as glass substrates and flat glass products, of the present invention, with some embodiments are transparent, translucent, or opaque. With some embodiments, the glass products or articles, such as glass substrates and flat glass products, of the present invention, are transparent and have a visible right transmittance (Lta) of equal or greater than 70 percent, such as equal to or great than 75 percent, or equal to or greater than 80 percent, in each case the Lta values being determined using a glass sample having a thickness of 5.664 mm (0.223 inches).

The glass compositions of the present invention can be processed in accordance with art-recognized methods, so as to form the glass products and articles of the present invention. For purposes of non-limiting illustration, the glass compositions of the present invention can be subjected to art-recognized processes, such as, but not limited to, crucible melt processes, sheet drawing processes, and float glass processes.

As discussed previously herein, the present invention provides a photovoltaic cell that includes a glass substrate and at least one semiconductor layer over the glass substrate. With some embodiments of the present invention, the at least one semiconductor layer of the photovoltaic cell comprises at least one of cadmium and telluride, such as cadmium-telluride (CdTe).

Photovoltaic cells typically include a glass substrate, and a plurality of layers formed over at least one side of the glass substrate. The layers typically include one or more transparent conductive oxide layers, one or more semiconductor layers (such as a p-type layer, which each absorb and convert actinic radiation, such as sunlight, into electricity), a window layer (such as an n-type layer), and a metallic electrical contact layer. With some embodiments, the photovoltaic cell further includes a backing layer or plate, such as a glass backing plate.

For purposes of non-limiting illustration and with reference to FIG. 1, photovoltaic cell 1 includes a glass substrate 11 according to the present invention that has a first surface 14 (which faces a light source 20) and a second surface 17. Glass substrate 11 is transparent, and with some embodiments has an Lta of at least 70 percent, such as at least 80 percent. A coating or layer stack 23 is provided over second surface 17 of glass substrate 11. Coating/layer stack 23 includes, with some embodiments, a low resistivity transparent conductive oxide (TCO) layer 26, which includes indium-tin oxide (ITO) in some embodiments, over second surface 17. Coating stack 23 further includes, with some embodiments, a high resistivity TCO layer 29 over the low resistivity ITO layer 26, which can include tin oxide ($SnO_2$). With some further embodiments, coating stack 23 further includes what is referred to in the art as a window layer 32, that includes, with some embodiments, n-doped CdS. Window layer 32 resides over high resistivity TCO layer 29. Coating stack 23 additionally includes a semiconductor layer 35, which can be a p-doped semiconductor layer. Semiconductor layer 35 resides over window layer 32. Semiconductor layer 35 includes, with some embodiments, CdTe. In accordance with some further embodiments, coating stack 23 further includes a metal contact layer 38, which can include Au or Ni—Al. Coating stack 23 can include one or more additional layers, not shown.

Photovoltaic cell 1 further includes, with some embodiments, a backing layer or plate 41. Backing plate 41 is formed over metal contact layer 38, with some embodiments. With some further embodiments, backing plate 41 is a glass backing plate 41, which can be a soda-lime glass backing plate 41.

With further reference to photovoltaic cell 1 of FIG. 1, as discussed previously herein, and for purposes of further non-limiting illustration, with some embodiments glass substrate 11 and glass backing plate 41 each have a coefficient of thermal expansion value, and the absolute value of the difference between the coefficient of thermal expansion values is minimal, which reduces or minimizes the likelihood of glass substrate 11 and/or glass backing plate 41 delaminating from photovoltaic cell 1, after exposure to repeated temperature fluctuations. Alternatively or additionally, the absolute value of the difference between the coefficient of thermal expansion values being minimized also improves the structural integrity of photovoltaic cell 1, for example, reducing the likelihood of one or more fissures propagating through one or more layers of coating stack 23, after exposure to repeated temperature fluctuations.

With some embodiments, the absolute value of the difference between the coefficient of thermal expansion values of the glass substrate and glass backing plate of a photovoltaic cell according to the present invention, is less than or equal to 10 ppm/° C., or less than or equal to 5 ppm/° C., or less than or equal to 1 ppm/° C., or less than or equal to 0.5 ppm/° C.

Figure 2:
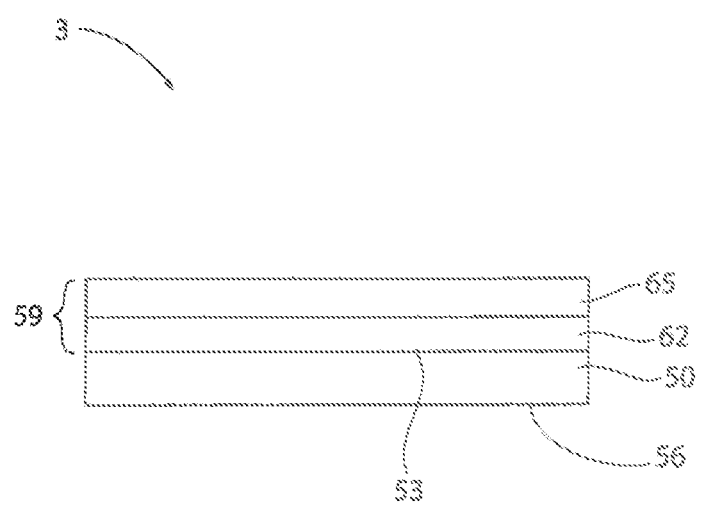
FIG. 2 is a representative sectional view of a magnetic recording article, in the form of a computer disk drive, according to the present invention.

The present invention also provides a magnetic recording article that includes a glass substrate according to the present invention. The magnetic recording article further includes one or more magnetic material layers formed over at least one surface of the glass substrate. With some embodiments, the magnetic recording article is a hard disc drive, such as used in conjunction with a computer. For purposes of non-limiting illustration, and with reference to FIG. 2, hard disc drive 3 includes a glass substrate 50, which has a first surface 53 and a second surface 56. A coating or layer stack 59 is formed over first surface 53 of glass substrate 50. Coating stack 59 includes, with some embodiments, a magnetic material layer 62 that resides over first surface 53 of glass substrate 50. Magnetic material layer 62 can, with some embodiments, include a plurality of magnetic material layers (not shown). Magnetic material layer 62, with some further embodiments, is or defines a perpendicular recording layer or medium.

Coating stack 59 of magnetic recording medium 3 includes, with some further embodiments, at least one further layer 65 that is formed over magnetic material layer 62. Further layer 65 can have a single or multiple layer structure composed of one or more inorganic layers and/or one or more organic polymer layers. With some embodiments further layer 65 is a protective layer.

The present invention is more particularly described in the following examples, which are intended to be illustrative only, since numerous modifications and variations therein will be apparent to those skilled in the art. It is to be understood, however, that the invention is not limited to the following examples. Unless otherwise specified, all pads and all percentages are by weight.

EXAMPLES

Examples A and B

Examples A and B provided in the following Table 1 are bulk glass compositions according to the present invention that were determined from computer models. The strain point and coefficient of thermal expansion (CTE) values recited in Table 1 were also determined from computer models. Examples A and B were not prepared from glass melts.

TABLE 1

|  | Example A (wt %) | Example B (wt %) |
| --- | --- | --- |
| $SiO_2$ | 69.30 wt % | 63.65 wt % |
| $Al_2O_3$ | 5.25 | 8.96 |
| $Na_2O$ | 8.24 | 9.29 |
| CaO | 17.18 | 18.03 |
| $K_2O$ | — | — |

TABLE 1-continued

|  | Example A (wt %) | Example B (wt %) |
| --- | --- | --- |
| $Li_2O$ | 0.03 | 0.07 |
| MgO | — | — |
| $Fe_2O_3$ | — | — |
| $SO_3$ | — | — |
| Total | 100.00 | 100.00 |
| Strain pt | 611° C. | 611° C. |
| CTE | 7.97 ppm/° C. | 8.61 ppm/° C. |

Example 1

Example 1 as provided in the following Table 2 is a bulk glass composition according to the present invention that was prepared from a glass melt that was prepared from the glass composition of Table 3. The strain point and CTE values recited in Table 2 were obtained by measurements that were performed on glass test samples obtained from the glass melt of the glass composition of Table 3, as described further herein.

TABLE 2

|  | Example 1 (wt %) |
| --- | --- |
| $SiO_2$ | 68.66 wt % |
| $Al_2O_3$ | 5.32 |
| $Na_2O$ | 8.65 |
| CaO | 17.10 |
| $K_2O$ | 0.013 |
| $Li_2O$ | 0.03 |
| MgO | 0.14 |
| $Fe_2O_3$ | 0.0076 |
| $SO_3$ | 0.082 |
| Total | 100.00 |
| Strain pt | 591° C. |
| CTE | 7.45 ppm/° C. |

TABLE 3

|  | Weight (grams) |
| --- | --- |
| Sand[1] | 348.00 |
| Soda Ash[2] | 70.00 |
| Limestone[3] | 155.00 |
| Salt Cake[4] | 2.81 |
| Alumina hydrate[5] | 40.30 |
| $Li_2CO_3$[6] | 0.38 |
| Total | 616.49 |

[1]The sand was obtained commercially from U.S. Silica Co., which was described as low iron sand, having $SiO_2$ as a major component.
[2]The soda ash was obtained commercially from FMC Corp., under the designation of Dense Grade 260, having $Na_2CO_3$ as a major component.
[3]The limestone was obtained commercially from Carmeuse Group under the designation MS 0-2, having $CaCO_3$ as a major component.
[4]The salt cake was obtained commercially from Saltex LLC, which was described as anhydrous glass grade, having $Na_2SO_4$ as a major component.
[5]The alumina hydrate was obtained commercially from Alcoa under the designation C-30, having $Al(OH)_3$ as a major component.
[6]The $Li_2CO_3$ was obtained commercially from Chemetall Foote Corp., which was described as technical grade.

The glass composition of Table 3 was processed in accordance with the following description.

Approximately 50% by weight of the materials of Table 3 were placed in a 4 inch platinum crucible and heated to 2500° F. (1371° C.). The temperature of the crucible was then held at 2500° F. (1371° C.) for 30 minutes. This initial molten material was then heated to a temperature of 2550°

F. (1399° C.) and held at that temperature for 30 minutes. The initial molten material was then heated to a temperature of 2650° F. (1454° C.), after which the remaining 50% by weight of the materials of Table 3 were added to the crucible. The combined contents of the crucible were held at a temperature of 2650° F. (1454° C.) for 30 minutes. This combined molten material was then heated to a temperature of 2700° F. (1482° C.) and held at that temperature for one hour. Next, the combined molten material was fritted in water. The fritted glass was separated from the water, dried, and reheated to 2750° F. (1510° C.) in a platinum crucible for two hours, which resulted in the formation of a second molten material. The second molten material was then poured out of the crucible to form a slab and annealed. Glass test samples were cut from the annealed slab. The glass test samples were ground and polished for chemical analysis. The bulk glass composition of Example 3, recited in Table 2 above, was determined by x-ray fluorescence spectrophotometric analysis of a ground and polished glass test sample. Other glass test samples were cut from the annealed slab and used to measure the strain point and thermal expansion coefficient values, which are recited in Table 2.

It will be readily appreciated by those skilled in the art that modifications can be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A glass composition comprising:
   $SiO_2$ 57 to 75 percent by weight;
   $Al_2O_3$ 3 to 11 percent by weight;
   $Na_2O$ 8.24 to 9.29 percent by weight;
   CaO 16 to 18.40 percent by weight; and
   $K_2O$ less than 0.05 percent by weight;
   wherein the source of alumina is alumina hydrate;
   wherein the glass composition is free of zirconium;
   wherein each percent by weight is based on total weight of said glass composition, and
   wherein a glass product prepared from said glass composition has, (i) a strain point in the range of 590° C. and 635° C., and (ii) a coefficient of thermal expansion of at least 7.4 ppm/° C. and less than 8.5 ppm/° C.

2. The glass composition of claim 1 wherein, $Al_2O_3$ is present in an amount of 4 to 10 percent by weight.

3. The glass composition of claim 1 wherein, $Al_2O_3$ is present in an amount of 4.5 to 9.5 percent by weight.

4. The glass composition of claim 1 wherein, a weight ratio of $Al_2O_3$ to $Na_2O$ is from 0.5 to 1.0.

5. The glass composition of claim 1 wherein, a weight ratio of $Al_2O_3$ to CaO is from 0.2 to 0.5.

6. The glass composition of claim 1 wherein, a weight ratio of $Na_2O$ to CaO is from 0.46 to 0.5.

7. The glass composition of claim 1 wherein,
   a weight ratio of $Al_2O_3$ to $Na_2O$ is from 0.5 to 1.0,
   a weight ratio of $Al_2O_3$ to CaO is from 0.2 to 0.5.

8. A glass product having a bulk glass composition comprising:
   $SiO_2$ 57 to 75 percent by weight;
   $Al_2O_3$ 3 to 11 percent by weight;
   $Na_2O$ 8.24 to 9.29 percent by weight;
   CaO 16 to 18.40 percent by weight; and
   $K_2O$ less than 0.05 percent by weight;
   wherein the source of alumina is alumina hydrate;
   wherein the bulk glass composition is free of zirconium;
   wherein each percent by weight is based on total weight of said bulk glass composition, and
   wherein said glass product has, (i) a strain point in the range of 590° C. to 635° C. and (ii) a coefficient of thermal expansion of at least 7.4 ppm/° C. and less than 8.5 ppm/° C.

9. The glass product of claim 8 wherein said glass product is a flat glass product.

10. A magnetic recording article comprising a glass substrate, wherein said glass substrate has a bulk glass composition comprising:
    $SiO_2$ 57 to 75 percent by weight;
    $Al_2O_3$ 3 to 11 percent by weight;
    $Na_2O$ 8.24 to 9.29 percent by weight;
    CaO 16 to 18.40 percent by weight; and
    $K_2O$ less than 0.05 percent by weight;
    wherein the source of alumina is alumina hydrate;
    wherein the bulk glass composition is free of zirconium;
    wherein each percent by weight is based on total weight of said bulk glass composition, and
    wherein said glass substrate has, (i) a strain point in the range of 590° C. to 635° C., and (ii) a coefficient of thermal expansion of at least 7.4 ppm/° C. and less than 8.5 ppm/° C.

11. A photovoltaic cell comprising a glass substrate and at least one semiconductor layer over said glass substrate, wherein said glass substrate has a bulk glass composition comprising:
    $SiO_2$ 57 to 75 percent by weight;
    $Al_2O_3$ 3 to 11 percent by weight;
    $Na_2O$ 8.24 to 9.29 percent by weight;
    CaO 16 to 18.40 percent by weight; and
    $K_2O$ less than 0.05 percent by weight;
    wherein the source of alumina is alumina hydrate;
    wherein the bulk glass composition is free of zirconium;
    wherein each percent by weight is based on total weight of said bulk glass composition, and
    wherein said glass substrate has, (i) a strain point in the range of 590° C. to 635° C., and (ii) a coefficient of thermal expansion of at least 7.4 ppm/° C. and less than 8.5 ppm/° C.

12. The photovoltaic cell of claim 11 wherein at least one semiconductor layer comprises at least one of cadmium and telluride.

13. The glass composition of claim 1 further comprising 0.14 weight percent of MgO.

14. The glass composition of claim 1 further comprising 0.082 weight percent of $SO_3$.

15. The glass composition of claim 1 wherein the $Al_2O_3$ is present in an amount of 5.32 weight percent.

16. The glass composition of claim of claim 13 further comprising 0.082 weight percent of $SO_3$, wherein the glass composition comprises:
    $SiO_2$ 68.66 percent by weight;
    $Al_2O_3$ 5.32 percent by weight;
    $Na_2O$ 8.65 percent by weight;
    CaO 17.1 percent by weight;
    $Li_2O$ 0.03 percent by weight;
    $K_2O$ 0.013 percent by weight; and
    $Fe_2O_3$ 0.0076 percent by weight.

17. The glass composition of claim 8 further comprising 0.14 weight percent of MgO.

18. The glass composition of claim 8 further comprising 0.082 weight percent of $SO_3$.

19. The glass composition of claim 8 wherein the $Al_2O_3$ is present in an amount of 5.32 weight percent.

20. The glass composition of claim 10 further comprising 0.14 weight percent of MgO.

21. The glass composition of claim 1, wherein the glass composition has a visible light transmittance (Lta) of at least 75% in a glass composition having a thickness of at least 5 mm.

* * * * *